United States Patent
Pelt et al.

(10) Patent No.: US 11,500,674 B2
(45) Date of Patent: Nov. 15, 2022

(54) CIRCUITRY WITH ADAPTIVE MEMORY ASSISTANCE CAPABILITIES

(71) Applicant: Intel Corporation, Santa Clara, CA (US)

(72) Inventors: Robert L. Pelt, Austin, TX (US); Hong Wang, Santa Clara, CA (US); Arifur Rahman, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/019,338

(22) Filed: Jun. 26, 2018

(65) Prior Publication Data

US 2019/0042306 A1 Feb. 7, 2019

(51) Int. Cl.
| | |
|---|---|
| G06F 9/46 | (2006.01) |
| G06F 9/48 | (2006.01) |
| G06F 8/41 | (2018.01) |
| G06F 12/126 | (2016.01) |
| G06F 9/52 | (2006.01) |

(Continued)

(52) U.S. Cl.
CPC ............ G06F 9/4881 (2013.01); G06F 8/445 (2013.01); G06F 8/4442 (2013.01); G06F 9/44505 (2013.01); G06F 9/5016 (2013.01); G06F 9/52 (2013.01); G06F 12/0811 (2013.01); G06F 12/0862 (2013.01); G06F 12/0871 (2013.01); G06F 12/0888 (2013.01); G06F 12/126 (2013.01); G06F 30/30 (2020.01);

(Continued)

(58) Field of Classification Search
CPC .. G06F 9/4881; G06F 9/44505; G06F 9/5016; G06F 9/52; G06F 8/445; G06F 12/0862; G06F 12/0871; G06F 12/126
See application file for complete search history.

(56) References Cited

U.S. PATENT DOCUMENTS

| 6,078,338 A | 6/2000 | Horan et al. |
| 6,553,411 B1 | 4/2003 | Dias et al. |

(Continued)

OTHER PUBLICATIONS

Cheng, Accelerator Synthesis and Integration for CPU+FPGA Systems, Electrical Engineering and Computer Sciences University of California at Berkeley, Dec. 15, 2016, 124 pages.*

(Continued)

*Primary Examiner* — Diem K Cao

(57) ABSTRACT

A system for running one or more applications is provided. Each application may require memory services that can be accelerated using configurable memory assistance circuits associated with different levels of a memory hierarchy. Integrated circuit design tools may be used to generate configuration data for programming the configurable memory assistance circuits. During compile time, the design tools may identify memory service patterns in a source code, match the identified memory service patterns to corresponding templates, parameterize the matching templates, and then synthesize the parameterized templates to produce the configuration data. During run time, a memory assistance scheduler may map the memory services required by each application to available memory assistance circuits in the (Continued)

system. The mapped memory assistance circuits are programmed by the configuration data to provide the desired memory service capability.

20 Claims, 8 Drawing Sheets

(51) Int. Cl.
*G06F 12/0862* (2016.01)
*G06F 12/0871* (2016.01)
*G06F 9/445* (2018.01)
*G06F 12/0811* (2016.01)
*G06F 12/0888* (2016.01)
*G06F 9/50* (2006.01)
*G06F 30/30* (2020.01)
*G06F 30/34* (2020.01)
*G06F 30/327* (2020.01)

(52) U.S. Cl.
CPC ............ *G06F 30/327* (2020.01); *G06F 30/34* (2020.01); *G06F 2212/1016* (2013.01); *G06F 2212/601* (2013.01)

(56) References Cited

U.S. PATENT DOCUMENTS

| | | | |
|---|---|---|---|
| 7,337,265 | B2 | 2/2008 | Humphrey et al. |
| 7,444,495 | B1 | 10/2008 | Snider |
| 8,117,137 | B2 | 2/2012 | Xu et al. |
| 9,182,912 | B2 | 11/2015 | Bert et al. |
| 9,256,369 | B2 | 2/2016 | Nazm et al. |
| 9,378,003 | B1* | 6/2016 | Sundararajan ........ G06F 8/4442 |
| 2013/0097680 | A1* | 4/2013 | Bendapudi ............ G06F 21/335 709/213 |
| 2013/0339621 | A1* | 12/2013 | Steely, Jr. ............ G06F 12/128 711/133 |
| 2016/0321176 | A1* | 11/2016 | Yoo ..................... G06F 12/0897 |

OTHER PUBLICATIONS

Pualino, Generation of Custom Run-time Reconfigurable Hardware for Treansparent Binary Acceleration, 2016, 201 pages.*
Sharma et al., Per-VM Page Cache Partitioning for Cloud Computing Platforms, COMSNETS, 2016, 8 pages.*

* cited by examiner

CIRCUITRY WITH ADAPTIVE MEMORY ASSISTANCE CAPABILITIES

BACKGROUND

This relates to integrated circuit systems and, more particularly, to methods and apparatus for improving the performance of integrated circuit systems using programmable logic.

Programmable logic circuits can be programmed by a user to implement a desired custom logic function. In a typical scenario, a logic designer uses computer-aided design tools to design a custom logic circuit. When the design process is complete, the computer-aided design tools generate configuration data. The configuration data is then loaded into configuration memory elements that configure the programmable logic circuits to perform the functions of the custom logic circuit.

Programmable devices may be used for coprocessing in big-data or fast-data applications. For example, programmable devices may be used in application acceleration tasks in a datacenter and may be reprogrammed during datacenter operation to perform different tasks. However, programmable logic has not been used to facilitate adaptive memory solutions within an integrated circuit or an integrated circuit package. Existing solutions for developing an application that leverages programmable logic are based on a high-level synthesis (HLS) design flow, which generates a hardware description based on a high-level synthesis source code. Such solutions, however, require the application developers to understand the underlying hardware architecture and to map the entire application using the HLS tool flow.

It is within this context that the embodiments described herein arise.

DETAILED DESCRIPTION

The present embodiments relate to integrated circuit systems and, in particular, to integrated circuit design tools configured to identify memory access patterns performed by a processor and to match the identified memory access patterns to a selected memory access template in a library of predetermined memory access templates. The selected memory access template can then be parameterized and synthesized to generate a configuration file for a programmable memory assistance circuit that is used accelerate memory access operations for the processor.

During runtime, an operating system may load an application that can be accelerated by the memory assistance circuit. The operating system may determine the compatibility between the required memory assistance circuit and the current hardware resources on the system, make runtime decisions for mapping memory access requests to available memory assistance circuits, and to prioritize different workloads. This method allows application developers to exploit programmable memory assistance circuits to improve performance, allows in-system upgrades, and can also help improve memory security.

It will be recognized by one skilled in the art, that the present exemplary embodiments may be practiced without some or all of these specific details. In other instances, well-known operations have not been described in detail in order not to unnecessarily obscure the present embodiments.

Figure 1:
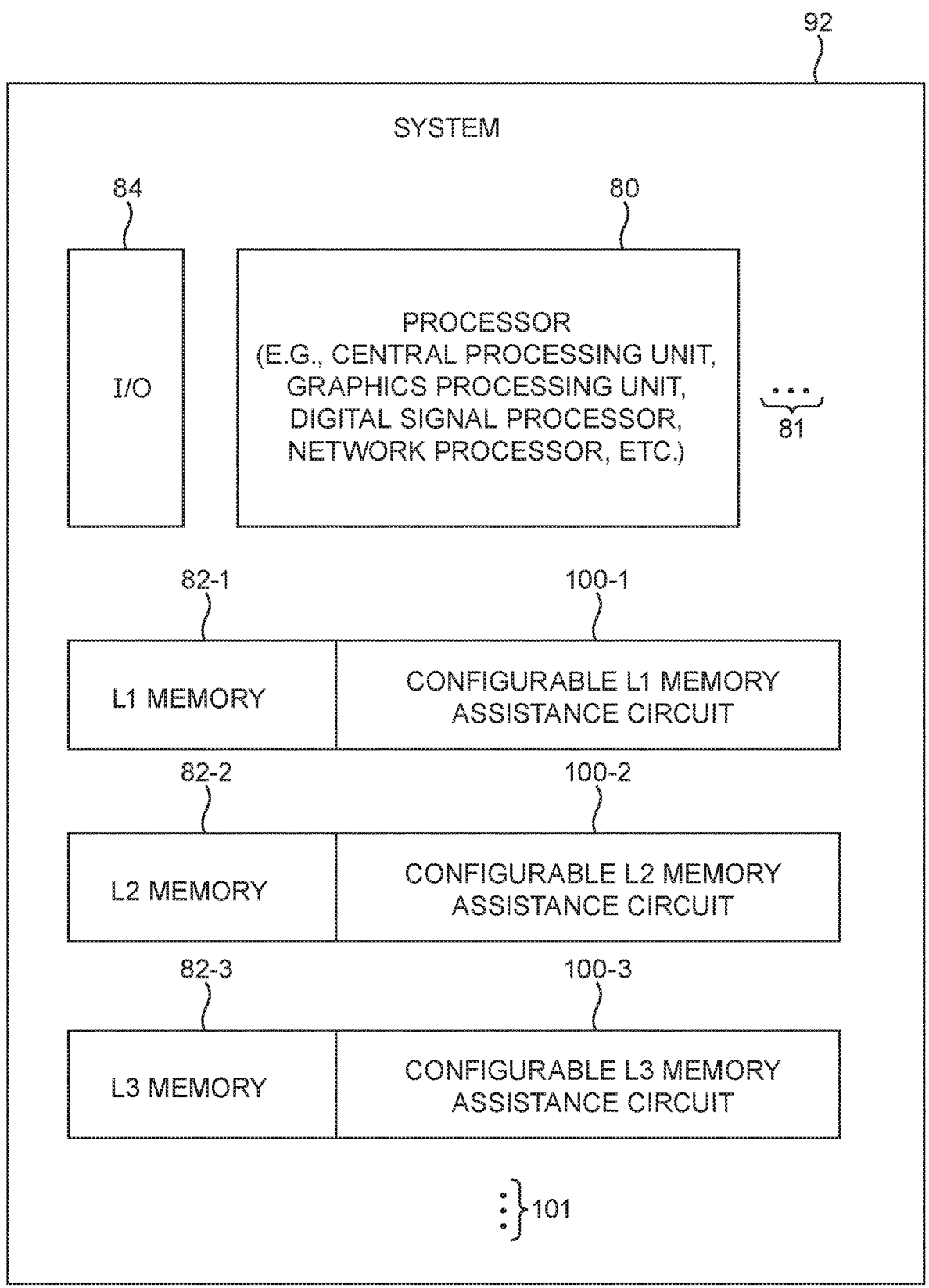
FIG. 1 is a diagram of an illustrative system that includes a processor and associated configurable memory assistance circuits in accordance with an embodiment.

FIG. 1 is a diagram of an illustrative system such as system 92 that includes a processor 80, input-output (IO) circuitry 84), and associated configurable memory assistance circuits. Processor 80 may be a central processing unit (CPU), a graphics processing unit (GPU), a digital signal processor (DSP), a network processor, or other suitable types of processing circuitry. In general, system 92 may include one or more processors as indicated by ellipsis 81.

System 92 may further include cache memory such as level-1 (L1) cache memory 82-1, level-2 (L2) cache memory 82-2, and level-3 (L3) cache memory 82-3. In general, system 92 may include any suitable levels of cache memory, as indicated by ellipsis 101. L1 memory 82-1 is generally built closer to processor 80 than L2 memory 82-2, so accessing L1 memory 82-1 is usually faster than accessing L2 memory 82-2. Similarly, L2 memory 82-2 is generally built closer to processor 80 than L3 memory 82-3, so accessing L2 memory 82-2 is usually faster than accessing L3 memory 82-3. Memory 82 can be used to temporarily store data so subsequent requests from processor 80 can be served faster as opposed to retrieving the data from main memory, which is much slower relative to cache memory.

In accordance with an embodiment, system 92 may include configurable memory assistance circuits for facilitating how processor 80 interacts with the various memory caches. In the example of FIG. 1, operations at L1 memory 82-1 may be optionally accelerated using configurable L1 memory assistance circuit 100-1; operations at L2 memory 82-2 may be optionally accelerated using configurable L2 memory assistance circuit 100-2; and operations at L3 memory 82-3 may be operationally accelerated using memory assistance circuit 100-3. Memory assistance circuits 100 may be implemented using programmable ("soft") logic circuitry and are sometimes referred to as reconfigurable, adaptable, or adjustable memory assist circuits. Memory assistance circuits 100 may be dynamically reconfigured based on application usage profiles.

The components of system 92 may be formed as part of a single integrated circuit die (as a system-on-chip or "SoC"), as multiple integrated circuit chips within a single multichip package, as parts of different packages on a circuit board, as parts of different circuit boards in a distributed system, etc. In general, system 92 may be a digital system or a hybrid system that includes both digital and analog subsystems. System 92 may be used in a wide variety of applications as part of a larger computing system, which may include but is not limited to: a datacenter, a computer networking system, a data networking system, a digital signal processing system, a graphics processing system, a video processing system, a computer vision processing system, a cellular base station, a virtual reality or augmented reality system, a network functions virtualization platform, an artificial neural network, an autonomous driving system, a combination of at least some of these systems, and/or other suitable types of computing systems.

Figure 2:
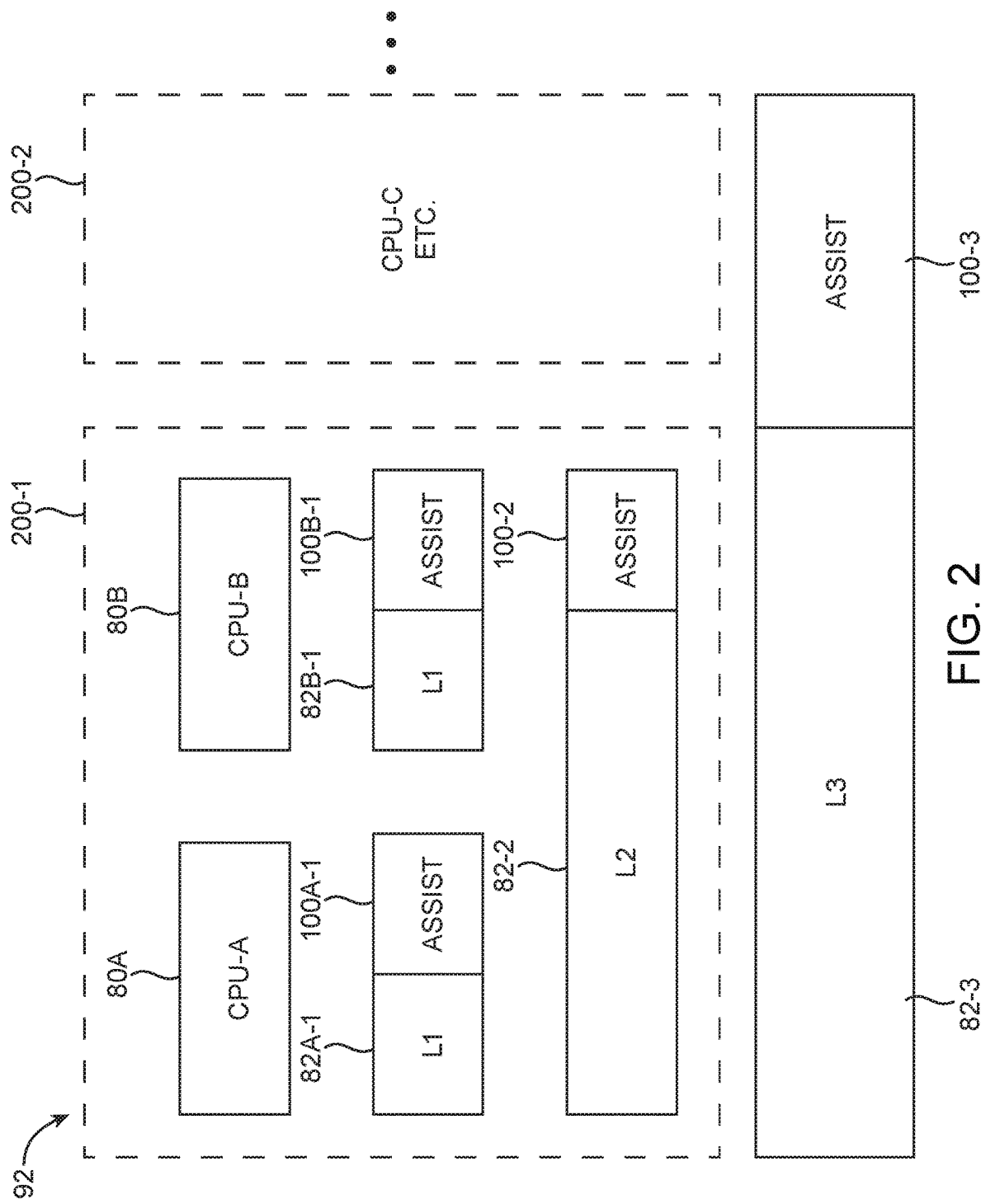
FIG. 2 is a diagram of an illustrative system that includes multiple CPU clusters and associated configurable memory assistance circuits in accordance with an embodiment.

System 92 may include more than one processor or CPU. FIG. 2 is a diagram showing system 92 having multiple CPU clusters 200. As shown in FIG. 2, system 92 may include a first CPU cluster 200-1 and a second CPU cluster 200-2. First CPU cluster 200-1 may include a first CPU 80A and a second CPU 80B. First CPU 80A may access L1 cache 82A-1, which is accelerated by memory assistance circuit 100A-1. Second CPU 80B may access L1 cache 82B-1, which is accelerated by memory assistance circuit 100B-1. Each L1 cache is generally dedicated to a single CPU. Both CPUs 80A and 80B may access L2 cache 82-2, which is accelerated by memory assistance circuit 100-2 (i.e., L2 cache 82-2 may be shared between CPUs 80A and 80B).

Second CPU cluster 200-2 may include one or more additional CPUs. In the example of FIG. 2, both CPU clusters 200-1 and 200-2 may access L3 cache 82-3, which is accelerated by memory assistance circuit 100-3 (i.e., L3 cache 82-3 may be shared between at least two different CPU clusters). The arrangement of FIG. 2 where the two CPUs in cluster 200-1 share a common L2 cache and where two different CPU clusters share a common L3 cache is merely illustrative. If desired, an L2 cache may be dedicated to a single CPU or may be shared among three or more CPUs or two or more CPU clusters, an L3 cache may be shared among three or more CPU clusters, etc.

Figure 3:
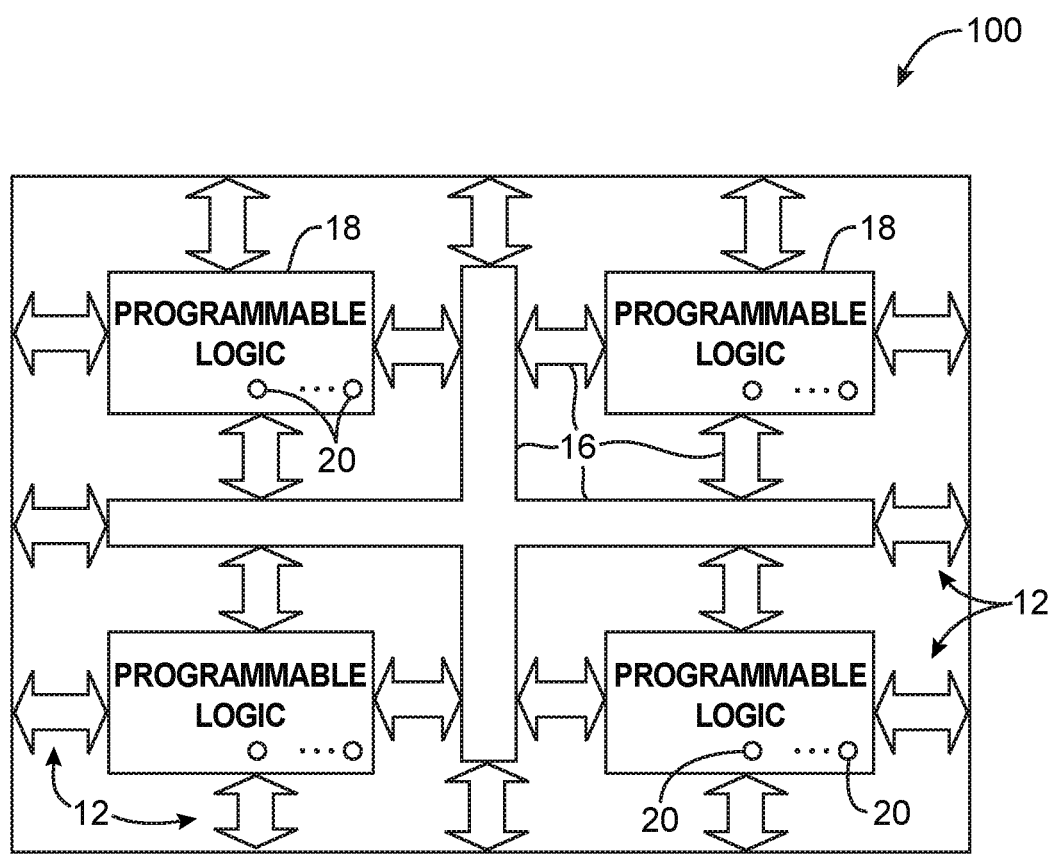
FIG. 3 is a diagram of programmable logic circuitry in accordance with an embodiment.

As described above, the memory assistance circuits distributed among the processors' memory cache hierarchy may be implemented using programmable logic circuitry. As shown in FIG. 3, a memory assistance circuit 100 may include programmable logic 18 and interconnection resources 16 such as global and local vertical and horizontal conductive lines and buses may be used to route signals within circuit 100. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. Programmable logic 18 may be organized into regions of functional blocks sometimes referred to as logic array blocks ("LABs"). Functional blocks such as LABs may include smaller programmable regions (e.g., logic elements, configurable logic blocks, or adaptive logic modules) that receive input signals and perform custom functions on the input signals to produce output signals.

Programmable logic 18 may contain memory elements 20 that can be loaded with configuration data (also called programming data). Once loaded, memory elements 20 may each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 4:
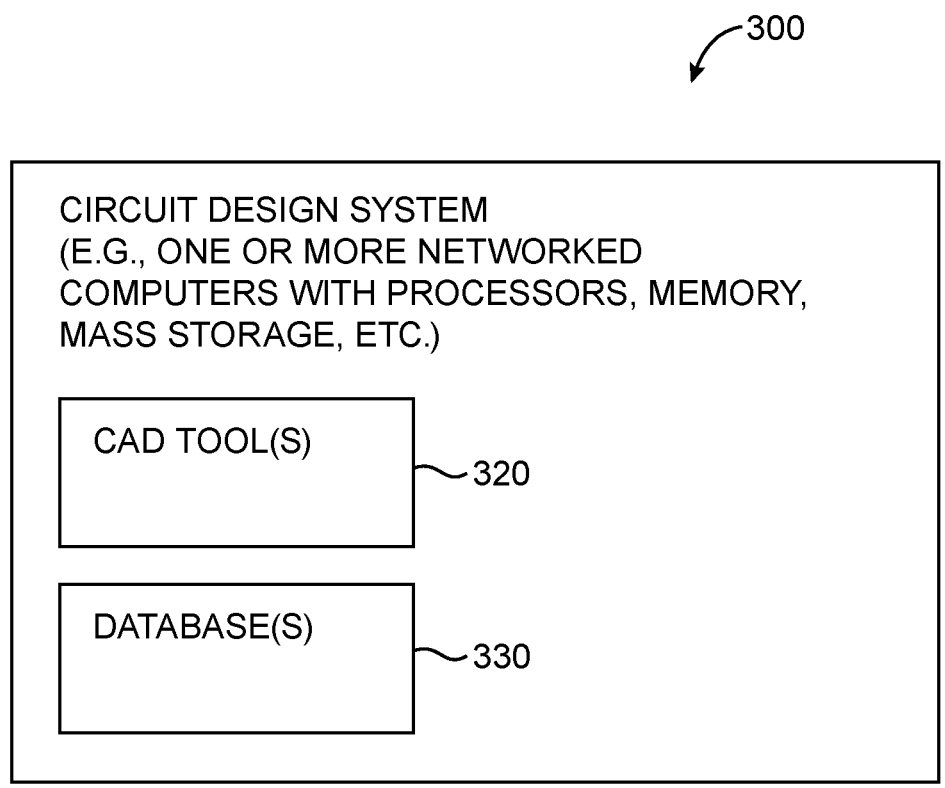
FIG. 4 is a diagram of a circuit design system that can be used to design integrated circuits in accordance with an embodiment.

It can be a significant undertaking to design and implement an integrated circuit design that includes programmable logic. Circuit designers therefore generally use logic design systems based on computer-aided-design (CAD) tools to assist them in designing logic circuits. A logic design system can help a logic designer design and test complex circuits for a system. An illustrative circuit design system 300 in accordance with an embodiment is shown in FIG. 4. Circuit design system 300 may be implemented on integrated circuit design computing equipment. For example, system 300 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 320 and databases 330 reside on system 300. During operation, executable software such as the software of computer aided design tools 320 runs on the processor(s) of system 300. Databases 330 are used to store data for the operation of system 300. In general, software and data may be stored on non-transitory computer readable storage media (e.g., tangible computer readable storage media). The software code may sometimes be referred to as software, data, program instructions, instructions, scripts, or code. The non-transitory computer readable storage media may include computer memory chips such as read-only memory (ROM), non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, floppy diskettes, tapes, or any other suitable memory or storage device(s).

Software stored on the non-transitory computer readable storage media may be executed on system 300. When the software of system 300 is installed, the storage of system 300 has instructions and data that cause the computing equipment in system 300 to execute various methods or processes. When performing these processes, the computing equipment is configured to implement the functions of circuit design system 300.

Computer aided design (CAD) tools 320, some or all of which are sometimes referred to collectively as a CAD tool, a circuit design tool, or an electronic design automation (EDA) tool, may be provided by a single vendor or by multiple vendors. Tools 320 may be provided as one or more suites of tools (e.g., a compiler suite for performing tasks associated with implementing a circuit design) and/or as one or more separate software components (tools). Database(s) 330 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 5:
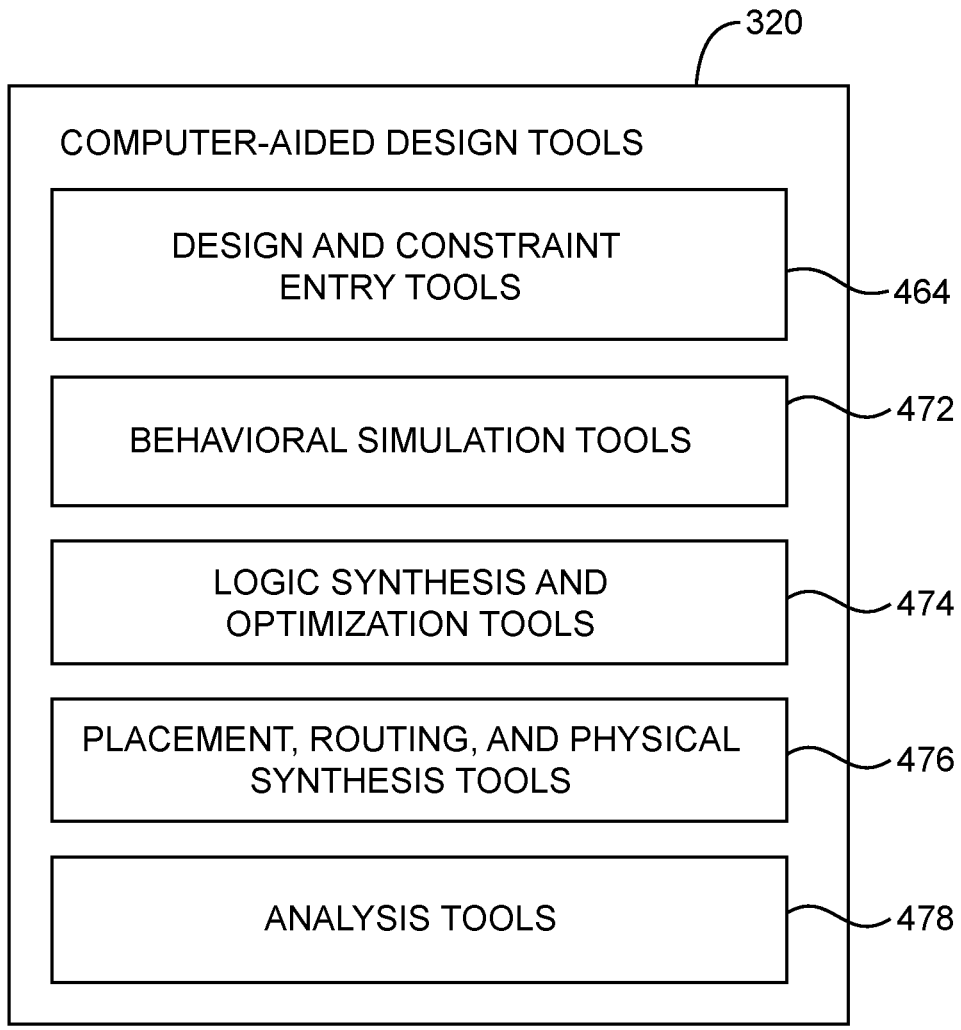
FIG. 5 is a diagram of illustrative computer-aided design (CAD) tools that may be used in a circuit design system in accordance with an embodiment.

Illustrative computer aided design tools 320 that may be used in a circuit design system such as circuit design system 300 of FIG. 4 to design programmable memory assistance circuits 100 are shown in FIG. 5. The design process may start with the formulation of functional specifications of the integrated circuit design (e.g., a functional or behavioral description of the integrated circuit design). A circuit designer may specify the functional operation of a desired circuit design using design and constraint entry tools 464.

Design and constraint entry tools 464 may be used to allow a circuit designer to provide a desired circuit design using any suitable format. For example, design and constraint entry tools 464 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 464 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 464 may allow the circuit designer to provide a circuit design software application code to the circuit design system 300 using a hardware description language such as Verilog hardware description language (Verilog HDL), Very High Speed Integrated Circuit Hardware Description Language (VHDL), SystemVerilog, or a higher-level circuit description language such as OpenCL, SystemC, C/C++, just to name a few. Blocks of code may be imported from user-maintained or commercial libraries if desired.

After the design has been entered using design and constraint entry tools 464, behavioral simulation tools 472 may be used to simulate the functionality of the circuit design. If the functionality of the design is incomplete or incorrect, the circuit designer can make changes to the circuit design using design and constraint entry tools 464. The functional operation of the new circuit design may be verified using behavioral simulation tools 472 before synthesis operations have been performed using tools 474. Simulation tools such as behavioral simulation tools 472 may also be used at other stages in the design flow if desired (e.g., after logic synthesis). The output of the behavioral simulation tools 472 may be provided to the circuit designer in any suitable format (e.g., truth tables, timing diagrams, etc.).

Once the functional operation of the circuit design has been determined to be satisfactory, logic synthesis and optimization tools 474 may generate a gate-level netlist of the circuit design, for example using gates from a particular library pertaining to a targeted process supported by a foundry, which has been selected to produce the integrated circuit. Alternatively, logic synthesis and optimization tools 474 may generate a gate-level netlist of the circuit design using gates of a targeted programmable logic circuit.

Logic synthesis and optimization tools 474 may optimize the design by making appropriate selections of hardware to implement different logic functions in the circuit design based on the circuit design data and constraint data entered by the logic designer using tools 464. As an example, logic synthesis and optimization tools 474 may perform multilevel logic optimization and technology mapping based on the length of a combinational path between registers in the circuit design and corresponding timing constraints that were entered by the logic designer using tools 464.

After logic synthesis and optimization using tools 474, the circuit design system may use tools such as placement, routing, and physical synthesis tools 476 to perform physical design steps (layout synthesis operations). Tools 476 can be used to determine where to place each gate of the gate-level netlist produced by tools 474. For example, if two counters interact with each other, tools 476 may locate these counters in adjacent regions to reduce interconnect delays or to satisfy timing requirements specifying the maximum permitted interconnect delay. Tools 476 create orderly and efficient implementations of circuit designs for any targeted integrated circuit (e.g., for a given programmable integrated circuit such as a field-programmable gate array (FPGA)).

Tools such as tools 474 and 476 may be part of a compiler suite (e.g., part of a suite of compiler tools provided by a programmable logic device vendor). In certain embodiments, tools such as tools 474, 476, and 478 may also include timing analysis tools such as timing estimators. This allows tools 474 and 476 to satisfy performance requirements (e.g., timing requirements) before actually producing the integrated circuit.

After an implementation of the desired circuit design has been generated using tools 476, the implementation of the design may be analyzed and tested using analysis tools 478. For example, analysis tools 478 may include timing analysis tools, power analysis tools, or formal verification tools, just to name few.

After satisfactory optimization operations have been completed using tools 320 and depending on the targeted integrated circuit technology, tools 320 may produce a mask-level layout description or configuration data for programming the soft logic circuitry (e.g., for programming the reconfigurable memory assistance circuits).

FIG. 5 is a flow chart of illustrative steps for using tools 320 to compile a design for an integrated circuit system of the type shown in FIGS. 1 and 2. At step 600, tools 320 may obtain a source code. The source code is sometimes referred to as a design or behavioral specification that is provided in the form of a software application source code (e.g., C code, C++ code, SystemC code, OpenCL code, etc.). The source code may be entered into design and constraint entry tools 464 of FIG. 5.

At step 602, tools 320 may convert the source code to a corresponding object file and combine the object file with runtime library files to create an executable file (sometimes referred to as an "executable binary"). The executable file may include program instructions that direct a given CPU or processor to perform a series of tasks.

At step 604, tools 320 may identify opportunities for memory assistance by detecting candidate memory service patterns in the source code. For example, consider a scenario in which the source code implements a video application with a defined stride pattern that grabs two-dimensional (2D) blocks of 20×10 pixels from a high-definition image (e.g., a video frame with 1920×1080 pixels). Tools 320 may identify this particular 2D stride pattern as a potential candidate for memory service acceleration.

At step 606, tools 320 may match the candidate memory service pattern identified at step 604 to a corresponding memory service template (e.g., a memory service template with similar behavior as the candidate stride pattern) in a library of predetermined memory service templates. In the video application example, tools 320 may select a memory prefetching template with a 2D striding capability from the library of predetermined memory service templates.

At step 608, tools 320 may extract key parameters from the source code and parameterize the selected memory service template. In the video application example, tools 320 may identify boundaries and the step size associated with the 2D stride pattern. If desired, this extraction step may be performed concurrently with step 604 before step 606. The selected memory prefetching template can then be parameterized using the identified boundary and step size information (as an example). This is merely illustrative. Different memory service templates may be configured using different types of parameters and any suitable number of extracted parameters. The memory service templates can be dynamically reconfigured based on the application usage profiles.

At step 610, tools 320 may use the parameterized memory service template to generate a corresponding configuration file for configuring a memory assistance circuit. The configuration file (sometimes referred to as a configuration bitstream) may include application-specific memory requirements such as the required memory size and performance constraints, which would dictate what level memory cache is needed. A memory assistance circuit configured using the configuration file generated in this way can help the CPU accelerate whatever memory servicing operation is required by the current application and can yield significant performance benefits.

At step 612, the executable file generated at step 602 and the configuration file generated at step 610 may be optionally combined to form a compiled application file. This marks the end of the compile time operations.

The video application example described above that can be accelerated using a 2D memory prefetch template is merely illustrative. The library of predetermined memory service templates may include templates of a variety of potential memory service types. For instance, the 2D memory prefetch operation that grabs sequential 2D blocks of data may be a subcategory of a broader "memory movement" category. A pointer chasing operation is another example of a subcategory under memory movement services and may involve identifying memory locations that are used to point to data locations, extracting information from those locations, and then prefetching the corresponding data. In general, memory movement services may include operations that involve moving memory data between processor memory hierarchies (e.g., between the CPU and the different levels of cache memory), moving memory data between the CPU and external memory, between the CPI and hard disks, between the CPU and network storage, between the CPU and associated input-output circuitry, etc. The library of predetermined memory service templates may include any suitable number and type of memory movement templates.

Another category of memory services is "memory barrier" operations, which generally involve monitoring and/or controlling access to particular memory locations. An example of a memory barrier service is application isolation, which prevents an application from accessing memory and resources assigned to other applications. Another example of a memory barrier service is application memory protection, which prevents other applications from accessing an application's protected memory space. The library of predetermined memory service templates may include any suitable number and type of memory barrier templates.

Another memory service category may be "memory maintenance" operations, which generally involve governing the policies of a processor's memory hierarchy. An example of a memory maintenance service is setting a cache replacement policy, which determines the allocation of data in the memory hierarchy and determines the data priority when conflicts arise. Another example of a memory maintenance service is setting a scrubbing policy, when determines the emergency security measures for clearing all data at a particular memory location. The library of predetermined memory service templates may include any suitable number and type of memory maintenance templates.

Yet another memory service category may be "memory computation" operations, which generally involve performing (arithmetic) computations on data stored on the cache memory or data inflight to the cache memory. Examples of memory computation operations include calculating the average value for a group of data blocks, performing a matching algorithm on a group of data blocks (e.g., by matching the data to some predetermined pattern), calculating estimates from a group of data blocks (e.g., by performing data extrapolation or regression analysis), etc. The library of predetermined memory service templates may include any suitable number and type of memory computation templates.

The various types or categories of memory service operations described above (e.g., memory movement, memory barrier, memory maintenance, and memory computation) are merely illustrative and are not intended to limit the scope of the present embodiments. The library of predetermined memory service templates may include templates for any number of memory service categories and subcategories. For example, the library may include memory barrier templates such as an application isolation template for facilitating a first type of memory barrier operation and an application memory protection template for facilitating a second type of memory barrier operation. As another example, the library may further include memory maintenance templates such as a cache replacement template for facilitating a first type of memory maintenance operation and a scrubbing template for facilitating a second type of memory maintenance operation. As yet another example, the library may further include memory computation templates such as a data averaging template, a data matching template, a data estimation template, etc. Any memory assistance circuit on system 92 may be programmed to perform one or more categories of memory services.

Figure 6:
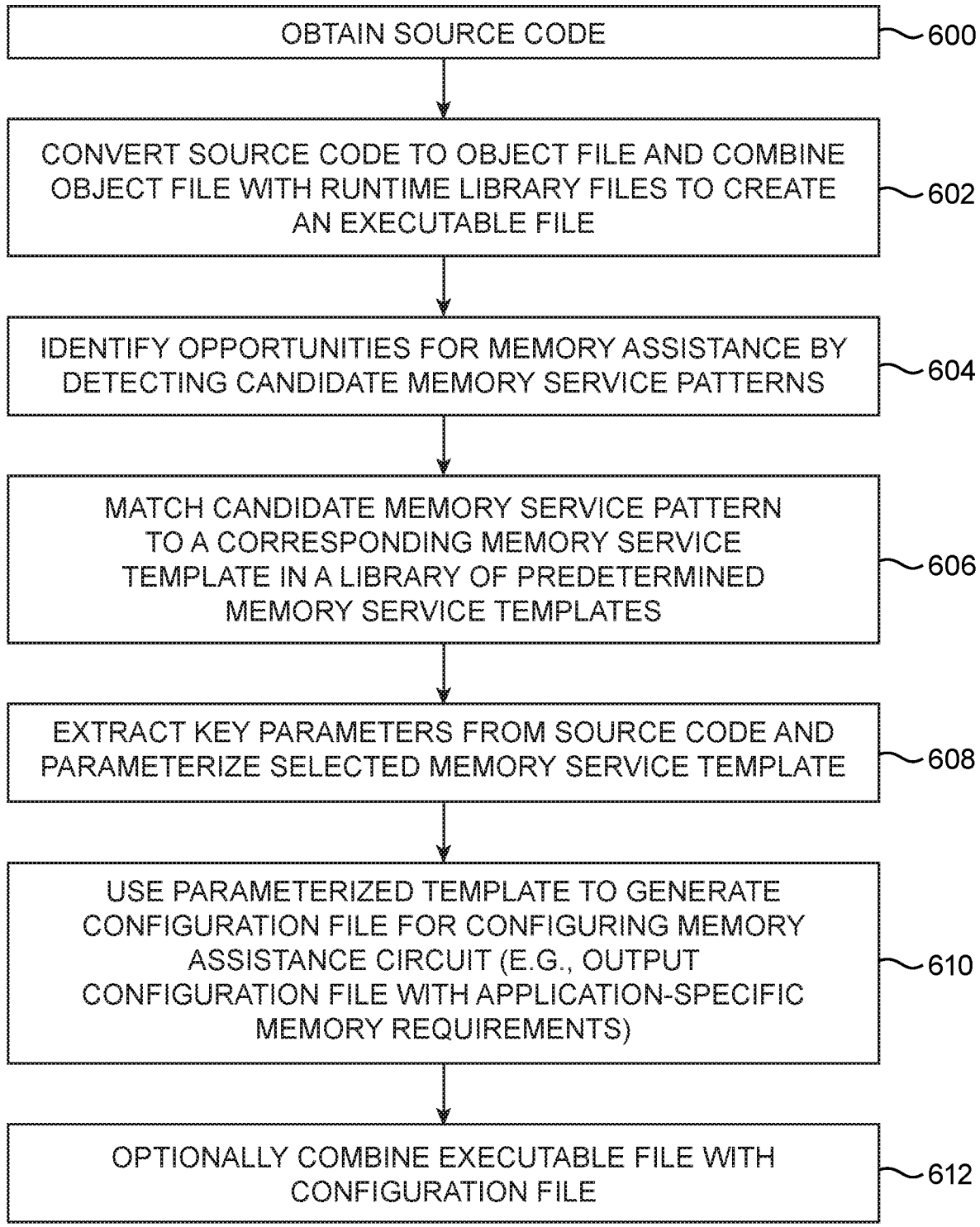
FIG. 6 is a flow chart of illustrative steps for implementing configurable memory assistance circuits at compile time in accordance with an embodiment.

In general, the process of FIG. 6 can be used to generate an executable file for running any number of applications and to generate a configuration file for programming any number of reconfigurable memory assistance circuits that are used to perform and accelerate the memory services required by the applications.

Figure 7:
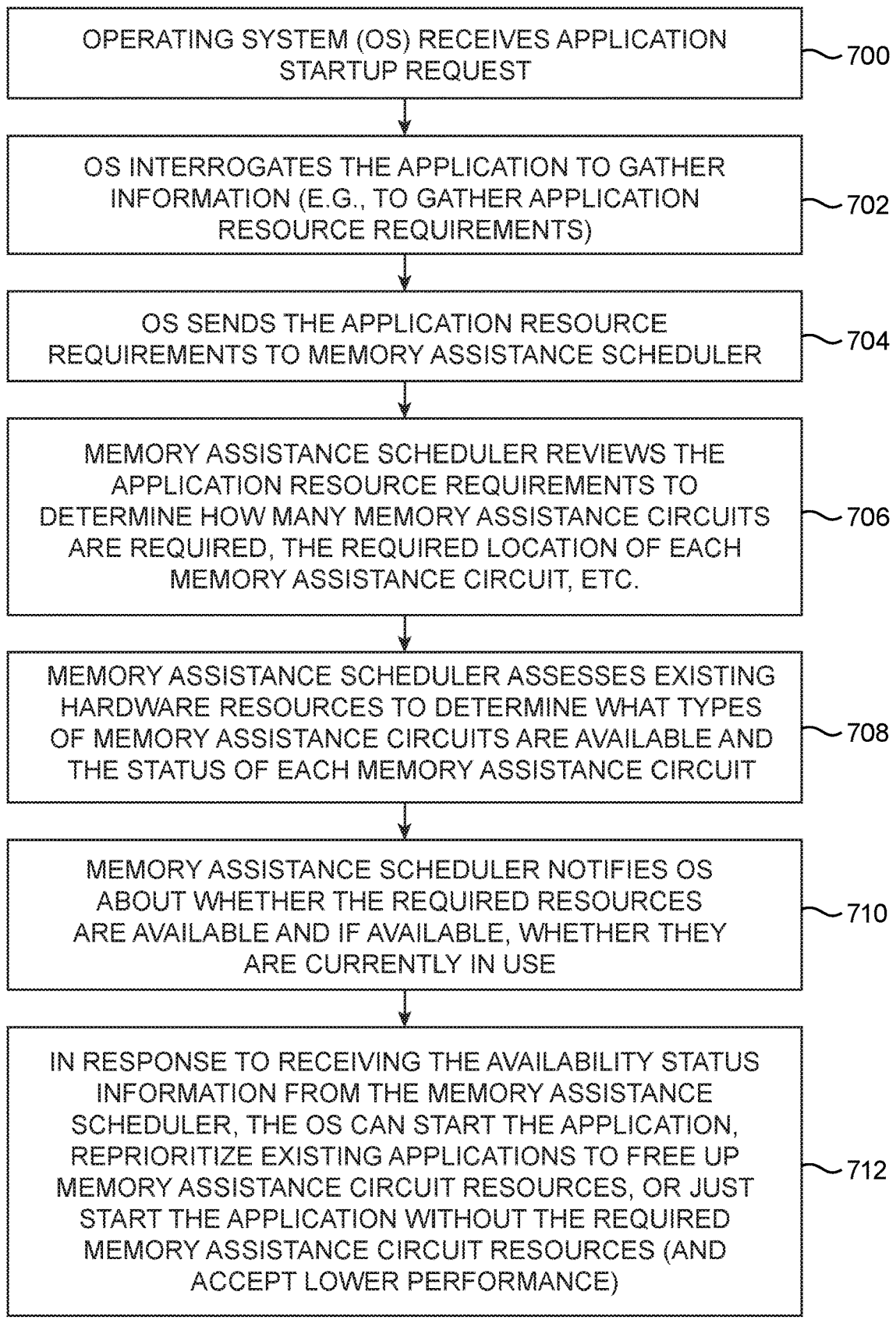
FIG. 7 is a flow chart of illustrative steps for loading an application and selectively programming the configurable memory assistance circuits at run time in accordance with an embodiment.

FIG. 7 is a flow chart of illustrative steps for loading an application and selectively programming the configurable memory assistance circuits at run time in accordance with an embodiment. At step 700, an operating system (OS) for running a system such as system 92 of FIG. 1 or FIG. 2 may receive an application startup request. For example, a user may initiate an application startup (e.g., by clicking a desktop icon).

Once the application is initiated, the operating system may interrogate the application to gather information at step 702. For example, the operating system may gather application resource requirements such as application memory requirements, input-output resource requirements, and memory assistance circuit resource requirements.

At step 704, the operating system may forward the application resource requirements (i.e., memory assistance circuit resource requirements) to a memory assistance scheduler. The memory assistance scheduler may sometimes be considered part of the operating system and may be configured to perform a variety of operations that help map the application resource requirements to one or more memory assistance circuits in system 92.

At step 706, the memory assistance scheduler may review the application resource requirements to determine how many memory assistance circuits are needed (e.g., how many programmable logic elements are needed to perform the required memory service acceleration), to determine the required location of each memory assistance circuit (i.e., whether each memory assistance circuit should be associated with an L1, L2, or L3 cache), etc.

At step 708, the memory assistance scheduler may assess the existing hardware resources in system 92 to determine what types of memory assistance circuits are available (i.e., whether an L1 cache memory assistance circuit is present and the how many logic elements it offers, whether an L2 cache memory assistance circuit is present and how many logic element it offers, or whether an L3 cache memory assistance circuit is present and how many logic element it offers) and to determine the status of each available memory assistance circuit (i.e., whether each memory assistance circuit is currently in use by some other application and which applications are already running on those "busy" memory assistance circuits). The term "available" means that a required memory assistance circuit is physically present, but an available memory assistance circuit can either be busy serving one or more other applications or idle (i.e., not currently serving any application). The term "unavailable" means that system 92 does not have the necessary hardware to meet the required application resource requirements.

At step 710, the memory assistance scheduler may notify the operating system about whether the resources required by the current initiating application are available. If the required application resources are actually available, the memory assistance scheduler may further provide information about whether the available memory assistance circuit(s) are currently in use by one or more other applications.

In response to receiving the availability and status information from the memory assistance scheduler, the operating system can either (1) start the application with the available and previously idle memory assistance circuits, (2) reprioritize the existing applications to free up one or more busy memory assistance circuits, or (3) just start the application without the required memory assistance circuits. Starting the application with all the required memory assistance resources will offer the optimal performance. Starting the application without the required memory assistance resources will cause the application to exhibit relatively lower performance.

In certain embodiments, system 92 may be configured to run multiple applications in parallel. In such scenarios, it is possible for the currently running applications to contend for the memory assistance circuit resources available on system 92. To avoid potential conflict, the operating system may prioritize and map the memory services requested by each application to corresponding memory assistance circuit resources.

Figure 8:
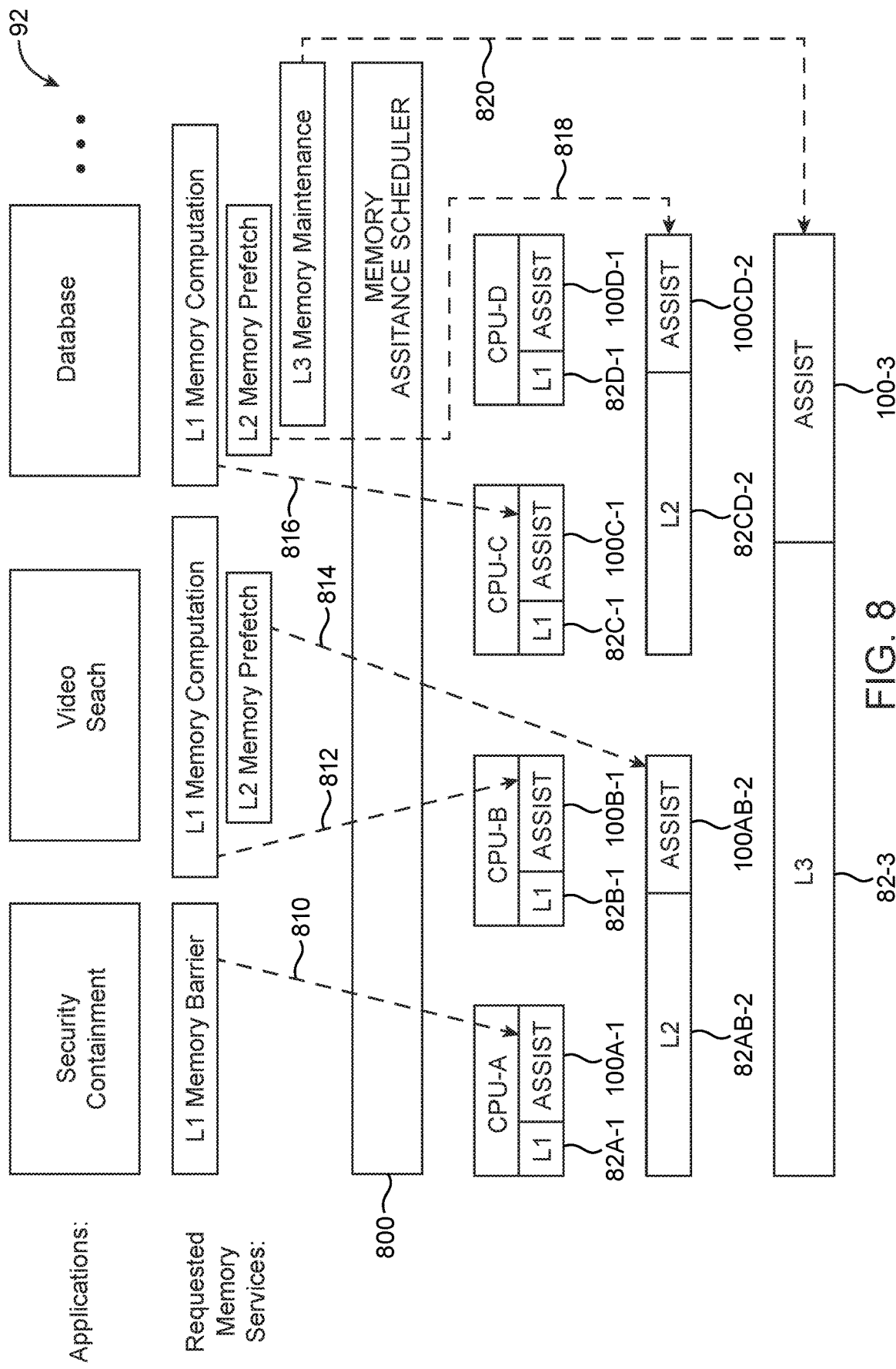
FIG. 8 is diagram of an illustrative system that can be used to run multiple applications, each of which utilizes memory services mapped to different configurable memory assistance circuits in accordance with an embodiment.

FIG. 8 is diagram of system 92 that can be used to run multiple applications, each of which utilizes memory services mapped to different configurable memory assistance circuits in accordance with an embodiment. As shown in FIG. 8, system 92 may concurrently support at least a security containment application, a video search application, and a database application. The security containment application may require an L1 memory barrier service. The video search application may require an L1 memory computation service and an L2 memory prefetch service. The database application may require an L1 memory computation service, an L2 memory prefetch service, and an L3 memory maintenance service.

A memory assistance scheduler such as memory assistance scheduler 800 may be configured to map the memory service requests associates with each application to corresponding available memory assistance hardware resources within system 92. In the example of FIG. 8, memory assistance scheduler 800 may map the L1 memory barrier service requested by the security containment application to memory assistance circuit 100A-1 (as indicated by arrow 810). Configured in this way, the security containment application may be run using CPU-A, and memory assistance circuit 100A-1 may perform application isolation or application memory protection for L1 cache 82A-1.

Memory assistance scheduler 800 may further map the L1 memory computation service and the L2 memory prefetch service requested by the video search application to memory assistance circuit 100B-1 (as indicated by arrow 812) and to memory assistance circuit 100AB-2 (as indicated by arrow 814), respectively. Configured in this way, the video search application may be run using CPU-B, and memory assistance circuit 100B-1 may perform data computation operations for L1 cache 82B-1 while memory assistance circuit 100AB-2 may perform memory prefetching operations on L2 cache 82AB-2. L2 cache 82AB-2 may be shared between CPU-A and CPU-B.

Memory assistance scheduler 800 may also map the L1 memory computation service, the L2 memory prefetch service, and the L3 memory maintenance service requested by the database application to memory assistance circuit 100C-1 (as indicated by arrow 816), to memory assistance circuit 100CD-2 (as indicated by arrow 818), and to memory assistance circuit 100-3 (as indicated by arrow 820), respectively. Configured in this way, the database application may be run using CPU-C, and memory assistance circuit 100C-1 may perform data computation operations for L1 cache 82C-1 while memory assistance circuit 100CD-2 may perform memory prefetching operations on L2 cache 82CD-2 and while memory assistance circuit 100-3 may set cache replacement or scrubbing policies for L3 cache 82-3 (as examples). L2 cache 82CD-2 may be shared between CPU-C and CPU-D. L3 cache 82-3 may be shared among CPU-A, CPU-B, CPU-C, and CPU-D.

The example of FIG. 8 in which system 92 simultaneously supports three different applications, each with its own set of requested memory services that are accelerated using corresponding memory assistance circuits at various levels of the memory hierarchy is merely illustrative. If desired, system 92 may also include a separate pool of memory assistance circuits configured to service one or more CPUs. For example, multiple memory assistance circuits from this pool can be efficiently allocated to serve a single CPU. In general, system 92 may be configured to support any number of applications, each of which can request one or more memory services that can be accelerated by available memory assistance hardware resources within system 92. The various memory assistance circuits used for accelerating the required memory services for each application are programmed using configuration data generated using tools 320 (see, e.g., the process shown in FIG. 6, where each requested memory service may be matched with a corresponding template in the library of predetermined memory service templates).

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art. The foregoing embodiments may be implemented individually or in any combination.

What is claimed is:

1. A system, comprising:
   a processor used to run an application;
   a first cache memory coupled to the processor, wherein the application issues a memory service request to the first cache memory; and
   a programmable memory assistance circuit configured to accelerate the memory service request for the application,
   wherein the memory service request issued by the application comprises a memory barrier service that comprises an application isolation operation for preventing the application from accessing a second cache memory associated with other applications running on the system, and wherein a library of predetermined memory service templates comprises a template for the memory barrier service.

2. The system of claim 1, further comprising:
   a third cache memory coupled to the processor, wherein the application issues an additional memory service request to the third cache memory, and wherein the memory service request and the additional memory service request are different types of memory service requests; and
   an additional programmable memory assistance circuit configured to accelerate the additional memory service request for the application.

3. The system of claim 2, wherein the first cache memory comprises a cache of a first level, and wherein the third cache memory comprises a cache of a second level different than the first level.

4. The system of claim 1, further comprising:
   an additional processor used to run an additional application;
   a third cache memory coupled to the additional processor, wherein the additional application issues an additional memory service request to the third cache memory; and
   an additional programmable memory assistance circuit configured to accelerate the additional memory service request for the additional application.

5. The system of claim 1, wherein the memory service request issued by the application comprises a memory movement service for moving data from the first cache memory to another location in the system.

6. The system of claim 5, wherein the memory movement service comprises a memory prefetch operation for retrieving data blocks with a size determined by the application.

7. The system of claim 1, wherein the memory barrier service monitors and controls access to the first cache memory.

8. The system of claim 1 further comprising:
   an additional processor used to run an additional application.

9. The system of claim 1, wherein the memory service request issued by the application comprises a memory maintenance service for governing policies for the first cache memory.

10. The system of claim 9, wherein the memory maintenance service comprises setting a cache replacement policy for determining data priority when memory access conflicts arise at the first cache memory.

11. The system of claim 1, wherein the memory service request issued by the application comprises a memory computation service for performing computations on data stored at the first cache memory.

12. The system of claim 11, wherein the memory computation service comprises a matching operation for comparing the data stored at the first cache memory to a predetermined pattern.

13. A method for implementing a system that includes a processor that issues a memory service request to a cache, the method comprising:
    obtaining a source code;
    identifying opportunities for memory assistance by detecting a candidate memory service pattern in the source code;
    matching the candidate memory service pattern to a selected memory service template in a library of predetermined memory service templates; and
    using the candidate memory service pattern to generate configuration data for programming a memory assistance circuit in the system, wherein the memory assistance circuit is configured to accelerate the memory service request at the cache.

14. The method of claim 13, wherein the library of predetermined memory service templates comprises at least a selected one of: a memory movement service template, a memory barrier service template, a memory maintenance service template, and a memory computation service template.

15. The method of claim 14, further comprising:
    extracting parameters from the source code;
    using the extracted parameters to parameterize the selected memory service template to generate a parameterized memory service template; and
    generating the configuration data based on the parameterized memory service template.

16. The method of claim 13, further comprising:
    using the source code to generate an executable file that controls the processor at runtime; and
    combining the executable file with the configuration data.

17. A method of operating a system having a central processing unit (CPU) that communicates with a cache, the method comprising:
    receiving an application startup request for an application;
    interrogating the application to gather application resource requirements;
    sending the application resource requirements to a memory assistance scheduler;

using the memory assistance scheduler to map the application resource requirements to corresponding memory assistance circuits on the system, wherein the memory assistance circuits are configured to accelerate memory service requests for the application at the cache;

assessing, using the memory assistance scheduler, existing hardware resources on the system to determine what types of the memory assistance circuits are physically present and to determine whether the physically present memory assistance circuits are in use by another application; and using the CPU to run the application.

18. The method of claim 17, further comprising:

reviewing, using the memory assistance scheduler, the application resource requirements to determine how many of the memory assistance circuits are required and a required location of each of the memory assistance circuits in the system.

19. The method of claim 18, further comprising:

notifying, using the memory assistance scheduler, an operating system about whether resources required by the application are available.

20. The method of claim 17, further comprising:

reprioritizing existing applications running on the system to free up at least one memory assistance circuit currently in use by one of the existing applications to help meet the application resource requirements of the application.

\* \* \* \* \*